(12) United States Patent
Huang et al.

(10) Patent No.: US 10,804,070 B2
(45) Date of Patent: Oct. 13, 2020

(54) DEFLECTION SCANNING DEVICE WITH MULTI-PHASE WINDING AND DEFLECTION SCANNING SYSTEM

(71) Applicant: GUILIN THD TECHNOLOGY CO., LTD, Guilin (CN)

(72) Inventors: Xiaodong Huang, Guilin (CN); Shouqi Wei, Guilin (CN); Yujiang Qin, Guilin (CN); Guokun Zhu, Guilin (CN); Shuli Cai, Guilin (CN); Xiang Fei, Guilin (CN); Guohua Huang, Guilin (CN); Jianfei Zhang, Guilin (CN); Yinhong Qin, Guilin (CN)

( * ) Notice: Subject to any disclaimer, the term of this patent is extended or adjusted under 35 U.S.C. 154(b) by 0 days.

(21) Appl. No.: 16/520,439

(22) Filed: Jul. 24, 2019

(65) Prior Publication Data

US 2020/0020503 A1 Jan. 16, 2020

Related U.S. Application Data

(63) Continuation of application No. PCT/CN2018/122635, filed on Dec. 21, 2018.

(30) Foreign Application Priority Data

Jan. 10, 2018 (CN) .......................... 2018 1 0023162
Jan. 10, 2018 (CN) ...................... 2018 2 0038588 U (51) Int. Cl.
*H01J 37/00* (2006.01)
*H01J 37/147* (2006.01)
(Continued)

(52) U.S. Cl.
CPC .... *H01J 37/1475* (2013.01); *H01J 37/32155* (2013.01); *G21K 1/093* (2013.01)

(58) Field of Classification Search
USPC ................................................. 250/396 ML
See application file for complete search history.

(56) References Cited

U.S. PATENT DOCUMENTS 3,656,013 A * 4/1972 Hooper ................. H02K 99/00
                                                      310/10
3,868,538 A * 2/1975 Blanchard ................ H03K 4/62
                                                      315/411
(Continued)

FOREIGN PATENT DOCUMENTS

CN          88102270 A      10/1988
CN          2077591 U        5/1991
(Continued)

OTHER PUBLICATIONS

International Search report of PCT/CN2018/122635.

*Primary Examiner* — Phillip A Johnston
(74) *Attorney, Agent, or Firm* — HYIP (57) ABSTRACT

The present invention relates to a deflection scanning device with a multi-phase winding and a deflection scanning system. The deflection scanning device is of an axisymmetric structure, and comprises a ferromagnetic frame and a deflection scanning winding, wherein the inner side of the ferromagnetic frame is longitudinally provided with 2aw wire slots equally distributed along the circumference; and the deflection scanning winding comprises a w-phase winding, wherein the axis of the each phase winding is symmetrically distributed. The deflection scanning system comprises a deflection scanning device, a drive power supply unit and, a central, control unit. The deflection scanning device of the present invention can improve the uniformity of the magnetic induction intensity in the charged particle beam channel, and then reduce the defocusing effect and improve the scanning accuracy.

6 Claims, 8 Drawing Sheets

(51) Int. Cl.
*H01J 37/32* (2006.01)
*G21K 1/093* (2006.01)

(56) References Cited

U.S. PATENT DOCUMENTS

| | | | | | |
|---|---|---|---|---|---|
| 4,010,396 | A | * | 3/1977 | Ress | G21B 1/00 |
| | | | | | 313/231.31 |
| 4,209,701 | A | * | 6/1980 | Dietrich | H01J 37/1416 |
| | | | | | 250/396 ML |
| 4,335,366 | A | | 6/1982 | Alig | |
| 4,633,208 | A | * | 12/1986 | Voss | G21K 1/08 |
| | | | | | 335/209 |
| 4,764,674 | A | * | 8/1988 | Kinoshita | H01J 37/285 |
| | | | | | 250/306 |
| 2002/0050569 | A1 | | 5/2002 | Berrian | |

FOREIGN PATENT DOCUMENTS

| | | |
|---|---|---|
| CN | 1148258 A | 4/1997 |
| CN | 103406657 A | 11/2013 |
| CN | 104635617 A | 5/2015 |
| CN | 105702545 A | 6/2016 |
| CN | 108305701 A | 7/2018 |
| CN | 207676667 U | 7/2018 |
| JP | S63141248 A | 6/1988 |
| JP | H02170333 A | 7/1990 |
| JP | 2007019061 A | 1/2007 |

\* cited by examiner

DEFLECTION SCANNING DEVICE WITH MULTI-PHASE WINDING AND DEFLECTION SCANNING SYSTEM

TECHNICAL FIELD

The present invention belongs to the technical field of charged particle beam processing equipment, and particularly relates to a deflection scanning device with a multi-phase winding and a deflection scanning system.

BACKGROUND

A deflection scanning device of the charged particle beam processing equipment has the function of pushing the charged particle beam to move on a plane perpendicular to the flight direction thereof, and the deflection scanning device includes an electric deflection scanning device and a magnetic deflection scanning device. The magnetic deflection scanning device includes a salient-pole structure and a non-salient-pole structure. When the charged particle beam deflects at a large wide angle, the additional defocusing generated by the non-salient-pole magnetic deflection scanning device is less than that of the salient-pole magnetic deflection scanning device. For the non-salient-pole magnetic deflection scanning device of an axisymmetric structure, if the turn density of each phase winding is distributed along the circumference of the cross section according to the sine law, the resultant magnetomotive force generated by the phase winding in the cross section of the scanning device is located on the axis of the phase winding, and the magnetic induction intensity of the effective acting region in the cross section is evenly distributed. The edge effect of the magnetic induction intensity at both ends of the inlet/outlet of the charged particle beam of the non-salient-pole magnetic deflection scanning device is neglected, and since the non-salient-pole magnetic deflection scanning device approaches to an ideal deflection scanning device, the original focusing state is almost kept after the charged particle beam passes through same.

In engineering practice, the turn density of each phase winding of the non-salient-pole magnetic deflection scanning device is impossibly strictly distributed along the circumference of the cross section, according to the sine law, but is quantitatively distributed in the limited number of slots according to the sine law. The result of the quantitative distribution of windings directly destroys the uniformity of the magnetic induction intensity in the charged particle beam channel, causing additional defocusing, and the farther the charged particle beam is from the center of the channel, the more serious the defocusing is.

From the circuit point of view, a winding of the magnetic deflection scanning device belongs to an inductive load, which requires a lower operating voltage at direct current or low frequency, and requires a higher operating voltage at high frequency. If the voltage of the DC power supply is low, the magnetic deflection scanning device will be limited in increase of operating frequency; and if the voltage of the DC power supply is high, the winding drive circuit has high power consumption and overheating when operating at low frequency, that is, the broadband deflection of the magnetic deflection scanning device is limited by the power consumption of the drive circuit.

At present, the deflection scanning device uses a winding with two phases symmetrically distributed to realize the plane deflection scanning of the charged particle beam. In the equipment for electron-beam powder bed additive manufacturing, a two-phase non-salient-pole magnetic deflection scanning device encounters the technical bottleneck caused by the above two factors in the process of realizing broadband and wide-angle deflection scanning.

SUMMARY

The technical problem to be solved by the present invention is how to solve the problem that the existing deflection scanning device with a 2-phase winding has the problems of serious additional defocusing caused by deflection scanning and narrow deflection scanning range and frequency range.

To solve the above technical problem, the present invention provides a scanning device with a multi-phase winding.

The deflection scanning device is of an axisymmetric trumpet or cylindrical structure, and the deflection scanning device comprises: a ferromagnetic frame and a deflection scanning winding, wherein the inner side of the ferromagnetic frame is provided with 2aw wire slots extending longitudinally and equally distributed along the circumference, and a charged particle beam channel of the deflection scanning device composed of a cavity enclosed by the inner wall of the ferromagnetic frame, where a and w are integers and a≥1, w≥3; and the deflection scanning winding comprises a w-phase winding, wherein the axis of the w-phase winding is symmetrically distributed on the cross section of the deflection scanning device;

each phase winding is connected with one phase drive circuit correspondingly, after energization, the w-phase winding produces resultant magnetomotive force perpendicular to the flight direction of the charged particle beam on the cross section of the deflection scanning device, the resultant magnetomotive force produces directly proportional resultant magnetic induction intensity, and the resultant magnetic induction intensity drives the charged particle beam to move on a plane perpendicular to the flight direction of the charged particle beam.

The present invention has the advantageous effect: the deflection scanning device increases the uniformity of magnetic induction intensity in the charged particle beam channel by using a multi-phase (greater than 2 phases) windings.

Further, the ferromagnetic frame is made of high-frequency magnetic conductive material.

Further, the included angle between axes of adjacent two phase windings is a radian angle of $$\Delta\theta = \frac{\pi}{w}$$

if w is even, the included angle between axes of adjacent two phase windings is a radian angle of $$\Delta\theta = \frac{2\pi}{w}$$

if w is odd, and the computational formula for distributed number of turns of any phase winding (12$i$) in any wire slot is:

$$\lambda_{i,n} = \int_{(i-1)\Delta\theta + \frac{(n-1)\pi}{aw}}^{(i-1)\Delta\theta + \frac{n\pi}{aw}} \sin\alpha\, d\alpha =$$

-continued $$\cos\left((i-1)\Delta\theta + \frac{(n-1)\pi}{aw}\right) - \cos\left((i-1)\Delta\theta + \frac{n\pi}{aw}\right);$$

$$z = \frac{Z_{min}}{\lambda_{min}};$$

$$Z_{i,n} = \lambda_{i,n} z;$$

where if $\lambda_{i,n}$ represents a coefficient of the number of turns of the $i^{th}$ (i=1, 2, . . . , w) phase winding in the $n^{th}$ (n=1, 2, . . . , 2aw) slot, and if is negative, $Z_{i,n}$ is also negative, indicating that the coiling directions of the windings are opposite, $\lambda_{min}$ represents a coefficient of the minimum positive number of turns in the 2aw slots, $Z_{min}$ represents a selected minimum positive integer number of turns corresponding to $\lambda_{min}$, z represents a reference value of the number of turns of each phase winding, $Z_{i,n}$ represents the number of turns of the $i^{th}$ phase winding in the $n^{th}$ slot, and the absolute value of $Z_{i,n}$ is rounded according to the absolute value of the computed value thereof.

The present invention also relates to a deflection scanning system with a multi-phase winding, comprising: a deflection scanning device, a central control unit and a drive power supply unit, wherein each phase winding in the deflection scanning device is connected with one phase drive circuit in the drive power supply unit correspondingly; and each phase drive circuit is connected with the central control unit;

the central control unit is used to sequentially divide predetermined charged particle beam deflection scanning tracks into a limited number of deflection scanning spots, sequentially compute the component magnetomotive force values of each phase winding of the w-phase winding respectively corresponding to each deflection scanning spot and sequentially send corresponding w-phase voltage instruction signals to corresponding w-phase drive circuits according to the component magnetomotive force values of all the deflection scanning spots; and the drive power supply unit comprises w-phase drive, circuits, wherein each phase drive circuit is used to convert one phase voltage instruction signal corresponding thereto into one phase current instruction signal including voltage instruction amplitude and differential value information thereof, and linearly amplify the phase current instruction signal; and supply a phase drive current amplified according to the phase current instruction signal to one phase winding correspondingly connected therewith in the deflection scanning device.

The present invention has the advantageous effects: when the phase winding drive circuits are consistent in performance, if the maximum resultant magnetomotive force of the deflection scanning device increases as the number of phases w increases, the scanning, range of the scanning device with, a multi-phase winding is wider than that of the deflection scanning device with a 2-phase winding; in addition, when the scanning range requirements are consistent, if each phase drive current of the deflection scanning device decreases as the number of phases w increases, on the premise that the power consumptions of the power amplifier tubes of the phase drive circuits are identical, the more the number of phases w of the scanning device is, the higher the allowable DC supply voltage value of the drive power supply unit thereof is, and the higher the supply voltage is, the faster the dynamic response speed of the current of the inductive winding of the deflection scanning device is, that is, the faster the scanning speed is.

Further, the drive power supply unit further comprises a pair of DC power supplies $E_1$ and $E_2$, wherein the pair of DC power supplies $E_1$ and $E_2$ are connected in series, are used to output positive and negative symmetrical voltage values to the w-phase drive circuits, and the common end of the pair of DC power supplies $E_1$ and $E_2$ is grounded.

Further, each of the phase, drive circuits comprises: an instruction input circuit, a push-pull amplifier circuit, a damping feedback circuit and an operation amplifier wherein one end of the instruction input circuit is connected with the central control unit, and the other end thereof is connected with the negative input end of the operation amplifier $A_i$;

the control end of the push-pull amplifier circuit is connected with one end of a control resistor $R_{6i}$, the positive and negative input ends of the push-pull amplifier circuit are connected with the positive and negative poles of the pair of DC power supplies $E_1$ and $E_2$ respectively, and the output end of the push-pull amplifier circuit is connected with one end of the damping feedback circuit and one end of a corresponding phase winding in the deflection scanning device respectively;

the other end of the damping feedback circuit is connected with the negative input end of the operation amplifier $A_i$; the output end of the operation amplifier $A_i$ is connected with the other end of the control resistor $R_{6i}$; the other end of the corresponding phase winding in the deflection scanning device is connected with the non-grounded end of a sampling resistor $R_{8i}$, and the other end of the sampling resistor $R_{8i}$ is grounded;

the non-grounded end of the sampling resistor $R_{8i}$ is also connected with one end of the feedback resistor $R_{7i}$, the other end of the feedback resistor $R_{7i}$ is connected to the negative input end of the operation amplifier $A_i$, the positive input end of the operation amplifier $A_i$ is connected with one end of a balancing resistor $R_{3i}$, the other end of the balancing resistor $R_{3i}$ is grounded, and the positive and negative input ends a the operation amplifier $A_i$ are connected with the positive and negative poles of the pair of DC power supplies $E_1$ and $E_2$.

The present invention has the further advantageous effect: the phase drive circuit is used to ensure that the current flowing through the phase scanning winding changes linearly with the phase current instruction signal which is a combination of a phase voltage instruction signal and a rate of change thereof, in this way, by reasonably selecting instruction input circuit parameters, the influence of magnetic path loss caused by current frequency variation on scanning accuracy can be suppressed or eliminated, and the scanning accuracy can be increased.

LEGENDS 1. deflection scanning device; 11. ferromagnetic frame; deflection scanning winding; 12$i$. phase winding; 2. drive power supply unit; 2$i$. phase drive circuit; 2$i$1. instruction input circuit; 2$i$2. push-pull amplifier circuit; 2$i$3 damping feedback circuit; 3. central control unit.

DETAILED DESCRIPTION

The present invention will be described below in combination with drawings. Described embodiments are only used for explaining the present invention, but are not intended to limit the scope of the present invention.

Embodiment 1

Figure 1:
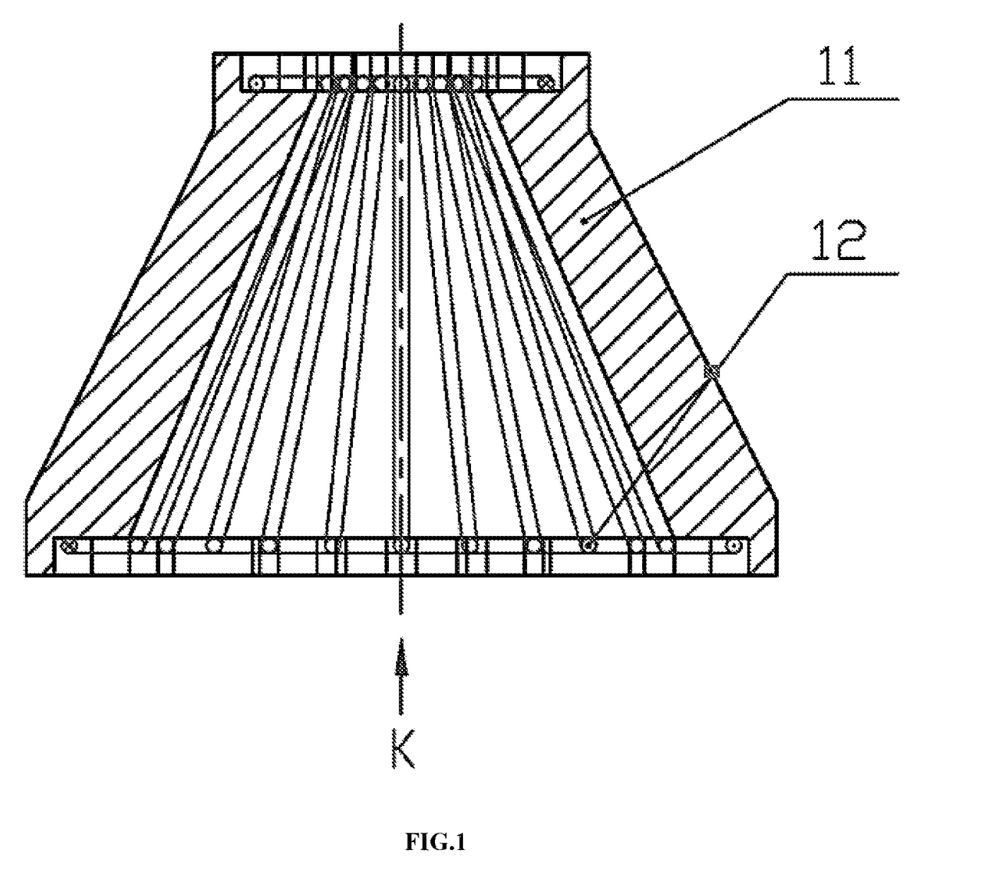
FIG. 1 is a structural section view of one deflection scanning device with a multi-phase winding of the present invention.
Figure 2:
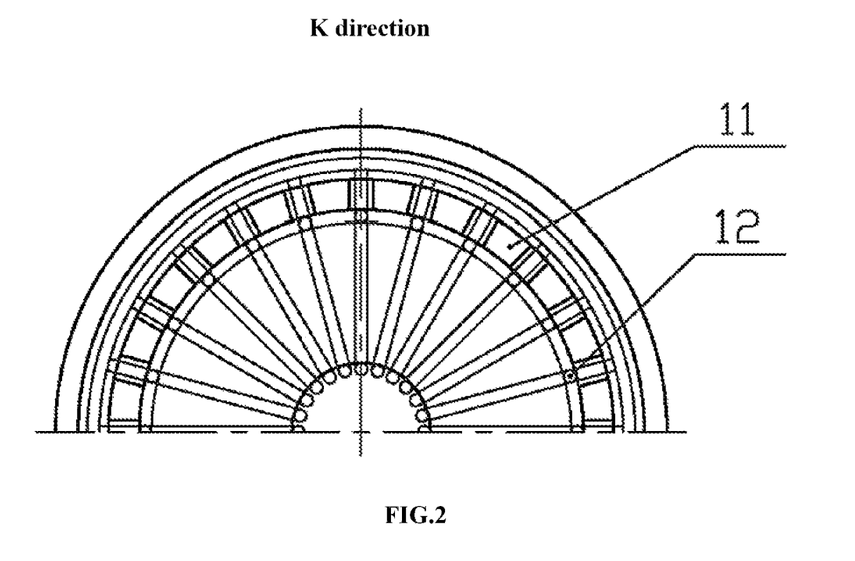
FIG. 2 is a structural bottom view of one deflection scanning device with a multi-phase winding of the present invention.
Figure 3:
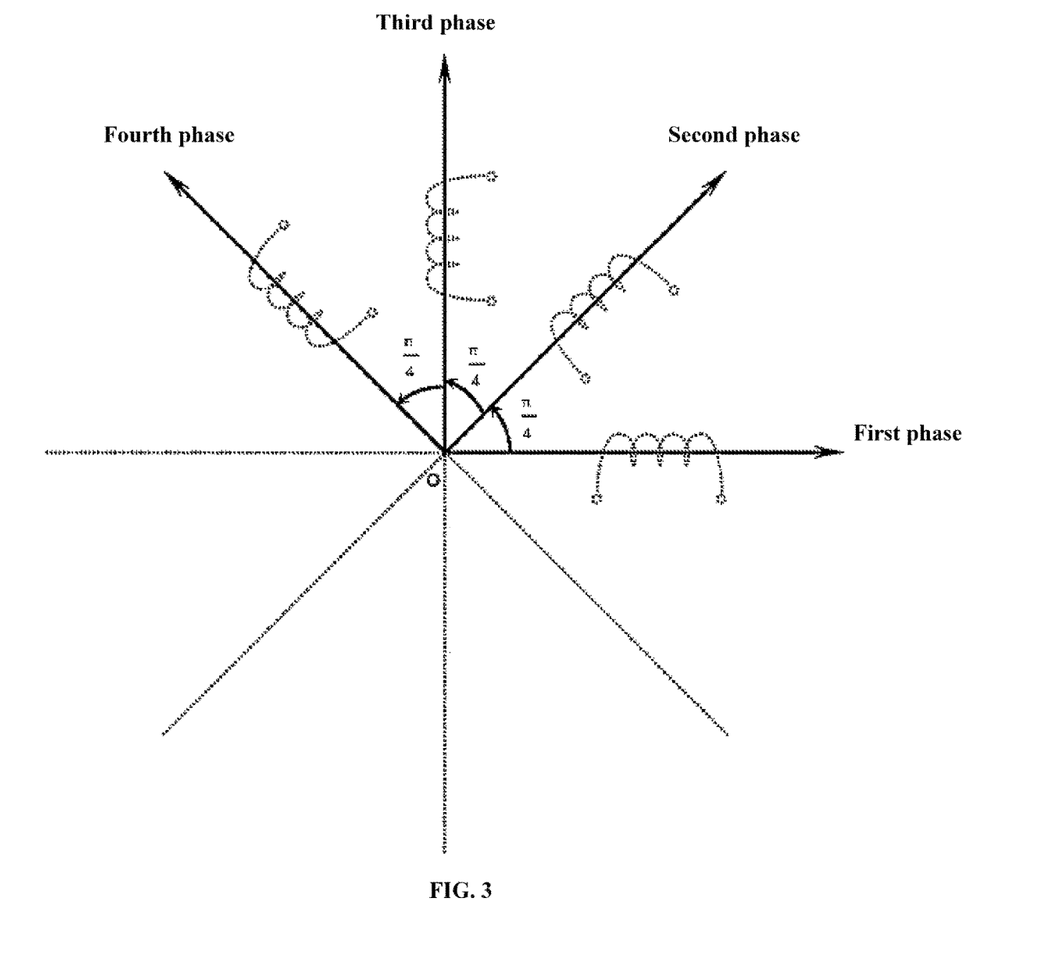
FIG. 3 is a distribution diagram of winding axes of one deflection scanning device with a multi-phase winding of the present invention.

As shown in FIG. 1 and FIG. 2, embodiment 1 of the present invention provides a deflection scanning device 1 with a 4-phase winding, the deflection scanning device 1 comprising: a ferromagnetic frame 11 and a deflection scanning winding 12, wherein the ferromagnetic frame 11 is made of high-frequency magnetic conductive material and is of an axisymmetric trumpet structure, the inner side of the ferromagnetic frame 11 is provided with 24 (a=3, w=4) wire slots extending longitudinally and equally distributed along the circumference, and an effective acting space of the magnetic induction intensity of the deflection scanning device 1 composed of a cavity enclosed by the inner wall of the ferromagnetic frame 11, the space being used as a flight channel for the charged particle beam to pass through the deflection scanning device 1;

the deflection scanning winding 12 is formed by coiling a varnished wire, the deflection scanning winding 12 is composed of an electrically and mutually insulated 4-phase winding, the axis of the 4-phase winding is symmetrically distributed on the cross section of the deflection scanning device 1, that is, there is a radian angle of $$\Delta\theta = \frac{\pi}{w}$$

between axes of every two phase windings, as shown in FIG. 3, each phase winding 12$i$ occupies 24 wire slots, and the computational formula for distributed number of turns of any phase winding 12$i$ in any wire slot is:

$$\lambda_{i,n} = \int_{(i-1)\Delta\theta + \frac{(n-1)\pi}{12}}^{(i-1)\Delta\theta + \frac{n\pi}{12}} \sin\alpha \, d\alpha = \cos\left((i-1)\Delta\theta + \frac{(n-1)\pi}{12}\right) - \cos\left((i-1)\Delta\theta + \frac{n\pi}{12}\right);$$

$$z = \frac{Z_{min}}{\lambda_{min}};$$

$$Z_{i,n} = \lambda_{i,n} z;$$

where if $\lambda_{i,n}$ represents a coefficient of the number of turns of the $i^{th}$ (i=1, 2, 3, 4) phase winding in the $n^{th}$ (n=1, 2, ..., 24) slot, and if $\lambda_{i,n}$ is negative, $Z_{i,n}$ is also negative, indicating that the coiling directions of the windings are opposite, $\lambda_{min}$ represents a coefficient of the minimum positive number of turns in the 24 slots, $Z_{min}$ represents a selected minimum positive integer number of turns corresponding to $\lambda_{min}$, the selected $Z_{min}$=2, z represents a reference value of the number of turns of each phase winding, z=2÷0.034074173711≈58.7, $Z_{i,n}$ represents the number of turns of the $i^{th}$ phase winding in the $n^{th}$ slot, and the absolute value of $Z_{i,n}$ is rounded according to the absolute value of the computed value thereof.

Each phase winding 12$i$ is connected with one phase drive circuit 2$i$ in the drive power supply unit 2 correspondingly, after energization, the 4-phase winding produces resultant magnetomotive force perpendicular to the flight direction of the charged particle beam on the cross section of the deflection scanning device 1, the resultant magnetomotive force produces directly proportional resultant magnetic induction intensity, and the resultant magnetic induction intensity drives the charged particle beam to move on a plane perpendicular to the flight direction of the charged particle beam. That is, after the charged particle beam passes through the deflection scanning device 1 in the axial direction, the axis of the charged particle beam is offset to the vertical direction of the resultant magnetic induction intensity on the cross section of deflection scanning device 1, and the offset taper angle is directly proportional to the amplitude of the resultant magnetic induction intensity on the cross section of deflection scanning device 1. In the case where other parameters are identical, the offset position coordinates of the charged particle beam are in one-to-one correspondence with the resultant magnetomotive force.

Figure 4:
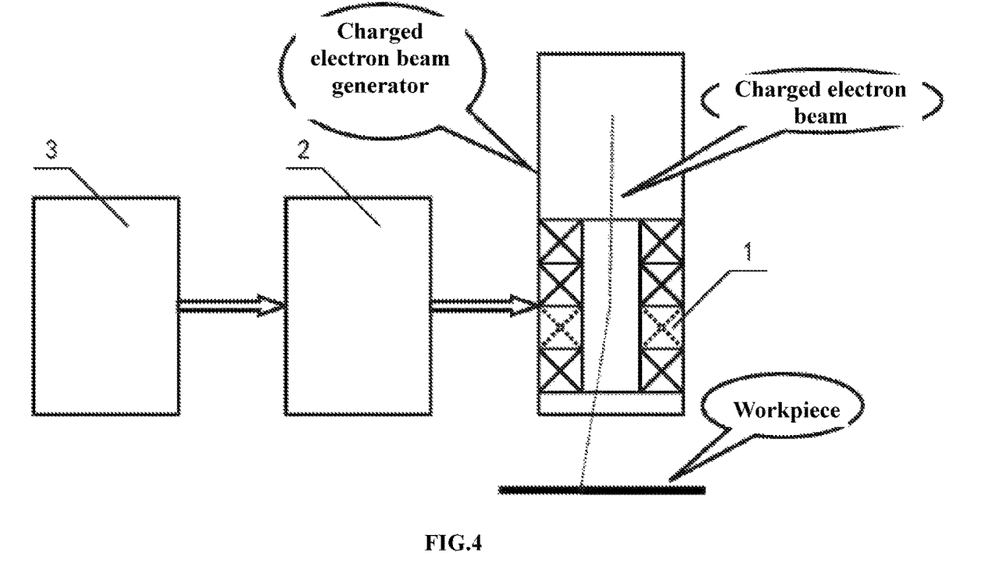
FIG. 4 is a schematic diagram of a deflection scanning system with a multi-phase winding of the present invention.

Embodiment 1 of the present invention also relates to a deflection scanning system with a 4-phase winding, as shown in FIG. 4, comprising a deflection scanning device 1, a central control unit 3 and a drive power supply unit 2, wherein each phase winding 12$i$ in the deflection scanning device 1 is connected with one phase drive circuit 2$i$ in the drive power supply unit 2 correspondingly; and each phase drive circuit 2$i$ is connected with the central control unit 3;

the deflection scanning device 1 is of a non-salient-pole structure and comprises a 4-phase winding, wherein the phase winding is connected with a corresponding $i^{th}$ phase drive circuit in the drive power supply unit 2, where i is 1, 2, 3 or 4; the deflection scanning device 1 is mounted at the charged particle beam outlet end of a charged particle beam generator, and the charged particle beam is deflected and emitted after passing through the deflection scanning device 1 and is emitted on the surface of a workpiece finally;

the drive power supply unit 2 is composed of 4-phase drive circuits, wherein the structures and performance of all phase drive circuits 2$i$ are identical, each phase drive circuit 2$i$ is used to convert one phase voltage instruction signal into one phase current instruction signal and then linearly amplify same, and supply one phase current $I_i$(t) amplified to a corresponding phase winding 12$i$ in the deflection scanning device 1 as a drive current;

the central control unit 3 is used to sequentially divide predetermined charged particle beam deflection scanning tracks into a limited number of deflection scanning spots, sequentially compute the component magnetomotive force values of each phase winding of the 4-phase winding respectively corresponding to each deflection scanning spot, and sequentially send corresponding 4-phase voltage instruction signals $U_1^*(t)$, $U_2^*(t)$, $U_3^*(t)$, $U_4^*(t)$ to corresponding 4-phase drive circuits according to the component magnetomotive force values of all the deflection scanning spots.

The drive power supply unit 2 comprises a pair of positive and negative power supplies $E_1$ and $E_2$ and 4-phase drive circuits, wherein the pair of DC power supplies $E_1$ and $E_2$ are used to output positive and negative symmetrical voltage values, and supply power to the 4-phase drive circuits, that is, the positive pole of the positive power supply $E_1$ is connected to the positive input ends of the 4-phase drive circuits simultaneously, the negative pole of the negative power supply $E_2$ is connected to the negative input ends of the 4-phase drive circuits simultaneously, and the common end of the pair of DC power supplies $E_1$ and $E_2$ is connected to the grounded ends of the 4-phase drive circuits simultaneously.

Figure 5:
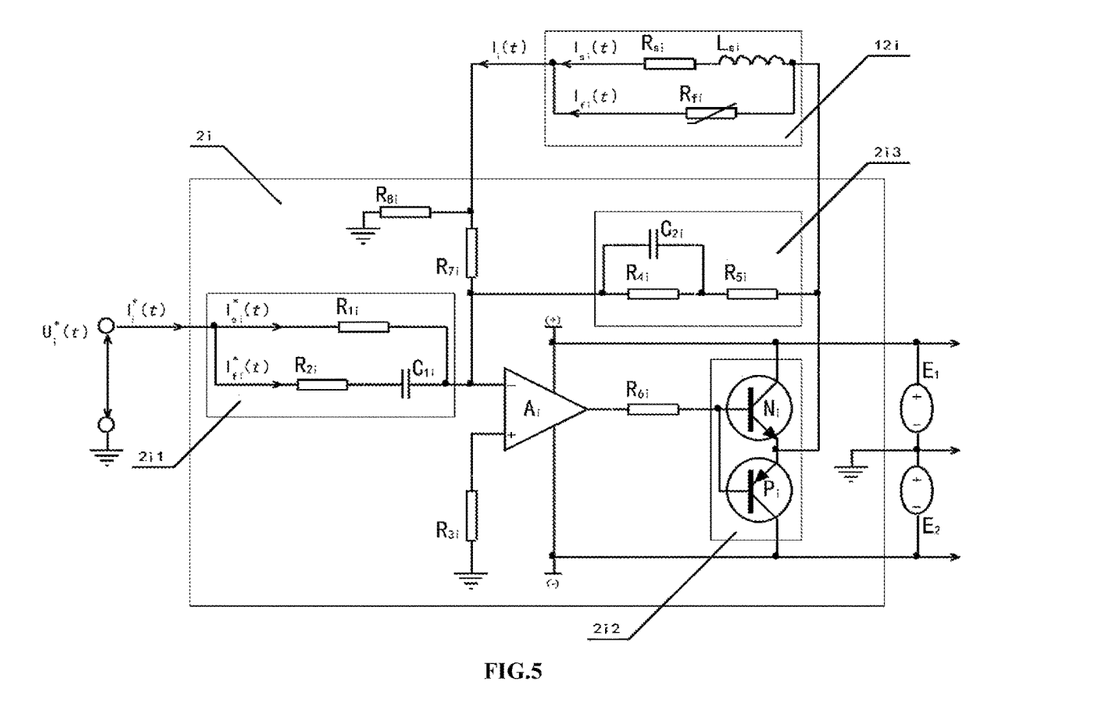
FIG. 5 is a diagram of a phase drive circuit of a deflection scanning device with a multi-phase winding of the present invention.

The structures and performance of the 4-phase drive circuits are identical, FIG. 5 shows a circuit diagram of a phase drive circuit 2i, the phase drive circuit 2i comprises: an instruction input circuit 2i1, a push-pull amplifier circuit 2i2, a damping feedback circuit 2i3, an operation amplifier $A_i$, a balancing resistor $R_{3i}$, a control resistor $R_{6i}$, a feedback resistor $R_{7i}$ and, a sampling resistor $R_{8i}$.

The instruction input circuit 2i1 is formed by connecting a resistor $R_{2i}$ with a capacitor $C_{1i}$ in series and then connecting same with a resistor $R_{1i}$ in parallel, one end of the instruction input circuit 2i1 as the input end of a phase voltage instruction signal $U_i^*(t)$ is connected with the central control unit 3, the other end of the instruction input circuit 2i1 is connected with the negative input end of the operation amplifier $A_i$, the phase voltage instruction signal $U_i^*(t)$ is converted into a phase current instruction signal $I_i^*(t)$ by the instruction input circuit 2i1, the relationship between a serial branch current instruction signal $U_i^*(t)$ of the instruction input circuit 2i1 and the phase voltage instruction signal $U_i^*(t)$ is determined by an differential equation $$\frac{dU_i^*(t)}{dt} = R_{2i}\frac{dI_{fi}^*(t)}{dt} + \frac{I_{fi}^*(t)}{C_{1i}},$$

that is $U_i^*(t)$ is related to the differential value (rate of change) of $U_i^*(t)$, the branch current instruction signal of the resistor $R_{1i}$ of the instruction input circuit 2i1 being $$I_{si}^*(t) = \frac{1}{R_{,i}}U_i^*(t),$$

and $I_i^*(t) = I_{si}^{n*}(t) + I_{fi}^{b*}(t)$;

the push-pull amplifier circuit 2i2 comprises an N-type power tube $N_i$ and a P-type power tube $P_i$, wherein the C pole of the N-type power tube $N_i$ is connected with the positive power supply end of the operation amplifier $A_i$ and is connected to the positive pole of the positive power supply $E_1$, the C pole of the P-type power tube $P_i$ is connected with the negative power supply end of the operation amplifier $A_i$ and is connected to the negative pole of the negative power supply $E_2$, the B pole of the N-type power tube $N_i$ is connected with the B pole of the P-type power tube $P_i$ and then is connected to the output end of the operation amplifier $A_i$ by the control resistor $R_{6i}$, and the E pole of the N-type power tube $N_i$ is connected with the E pole of the P-type power tube $P_i$ and then is used as the output end of the push-pull amplifier circuit 2i2;

the damping feedback circuit 2i3 is formed by connecting a resistor $R_{4i}$ with a capacitor $C_{2i}$ in parallel and then connecting same with a resistor $R_{12i}$ in series, one end of the damping feedback circuit 2i3 is connected with the negative input end of the operation amplifier $A_i$, and the other end thereof is connected with the output end of the push-pull amplifier circuit 2i2;

one end of the corresponding phase winding 12i is connected with the output end, of the push-pull amplifier circuit 2i2, the other thereof is connected with the grounded end through the sampling resistor $R_{8i}$, a voltage signal directly proportional to the exciting current $I_i(t)$ of the corresponding phase winding 12i is produced on the sampling resistor $R_{8i}$, and the voltage signal is fed back to the negative input end of the operation amplifier $A_i$ by the feedback resistor $R_{7i}$; and the positive input end of the operation amplifier $A_i$ is grounded by the balancing resistor $R_{3i}$.

The phase winding 12i is connected with a phase winding resistor $R_{si}$ in series by a phase winding inductor $L_{si}$ and then is connected with a phase magnetic circuit loss resistor $R_{fi}$ in parallel to form an equivalent circuit so as to simulate electrical characteristics thereof, wherein the phase winding inductor $L_{si}$ intensively reflects distributed inductors of the phase winding 12i, the phase winding resistor $R_{si}$ intensively reflects conductor distributed resistors of the phase winding 12i, the phase winding inductor $L_{si}$ and, the phase winding resistor $R_{si}$ may be considered as linear elements, the phase magnetic circuit loss resistor $R_{fi}$ is a virtual parameter characterizing magnetic circuit loss of the phase winding 12i, the higher the operating current frequency is, the larger the magnetic circuit loss is. Therefore, the phase magnetic circuit loss resistor $R_{fi}$ is a nonlinear element whose value is related to the operating current frequency.

One phase drive circuit 2i in the drive power supply unit 2 receives the phase voltage instruction signal $U_i^*(t)$ sent by the central control unit 3, converts the phase voltage instruction, signal $U_i^*(t)$ into a current instruction signal $I_i^*(t)$ including a combination of amplitude of the phase voltage instruction signal $U_i^*(t)$ and a differential value $$\frac{dU_i^*(t)}{dt}$$

thereof, wherein the current instruction signal $I_i^*(t)$ is linearly amplified by the phase drive circuit 2i and then is provided for the phase winding 12i as an exciting current $I_i(t)$, so that the exciting current $I_i(t)$ of the phase drive circuit 2i linearly changes with the phase current instruction signal $I_i^*(t)$. However, the current $I_{si}(t)$ flowing through the serial branch of the phase winding inductor $L_{si}$ and the phase winding resistor $R_{si}$ is the effective exciting current of the phase winding 12i. Parameters of the instruction input circuit 2i1 in the phase drive circuit 2i are reasonably selected, so that the action of the current instruction signal $I_{fi}^*(t)|$ of the serial branch can compensate or cancel the influence of the branch current $I_{fi}(t)$ of the phase magnetic circuit loss resistor $R_{fi}$, and the components of the effective exciting current $I_{si}(t)$ of the exciting current $I_{si}(t)$ of the phase winding 12i linearly changes with the phase voltage instruction signal $U_i^*(t)$ as far as possible.

Embodiment 2

Figure 6:
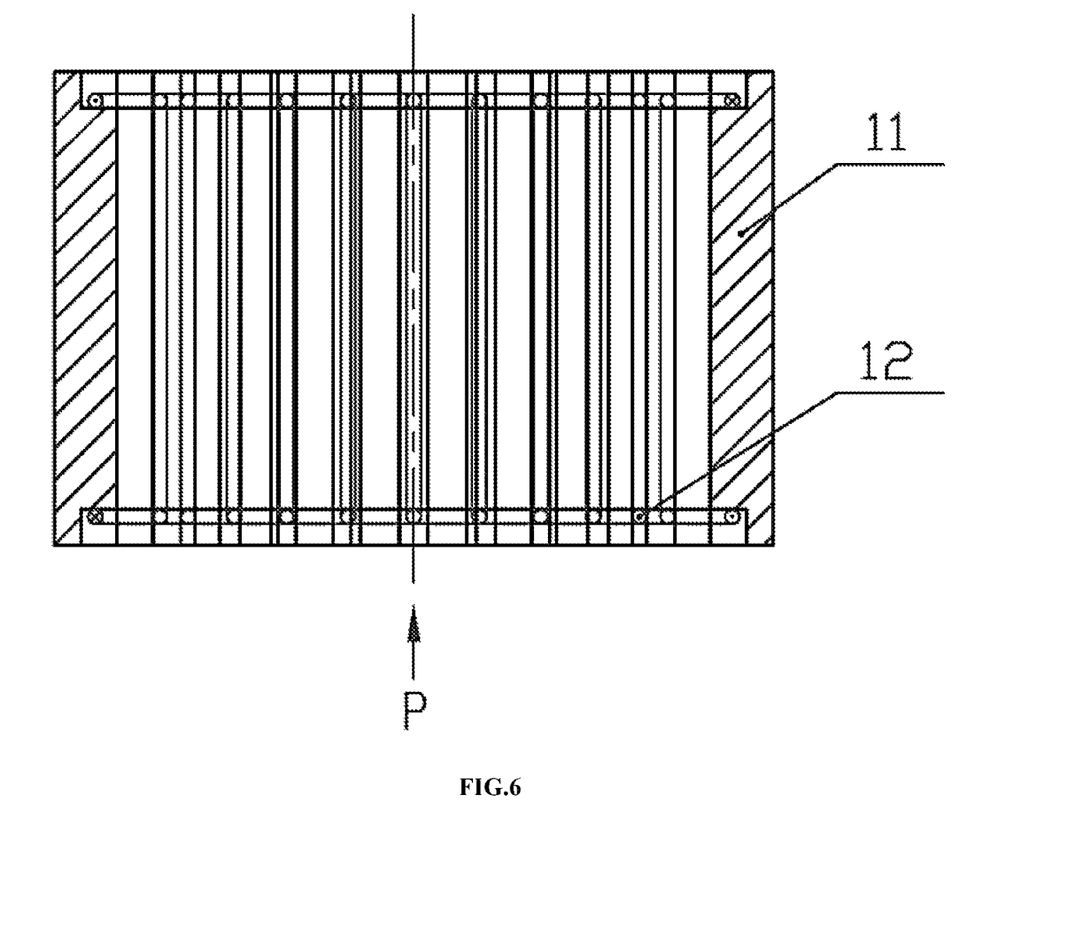
FIG. 6 is a structural section view of another deflection scanning device with a multi-phase winding.
Figure 7:
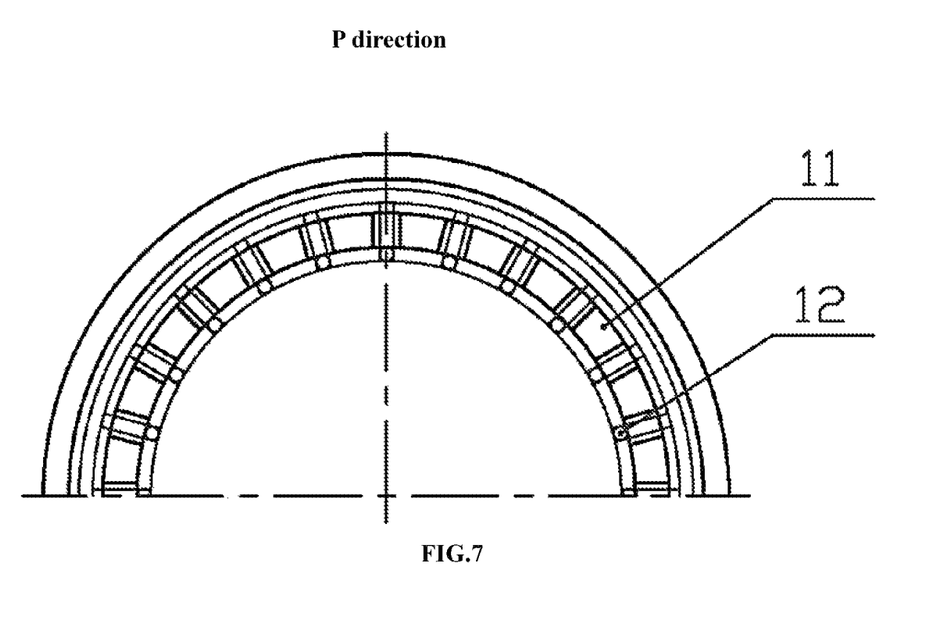
FIG. 7 is a structural bottom view of another deflection scanning device with a multi-phase winding.
Figure 8:
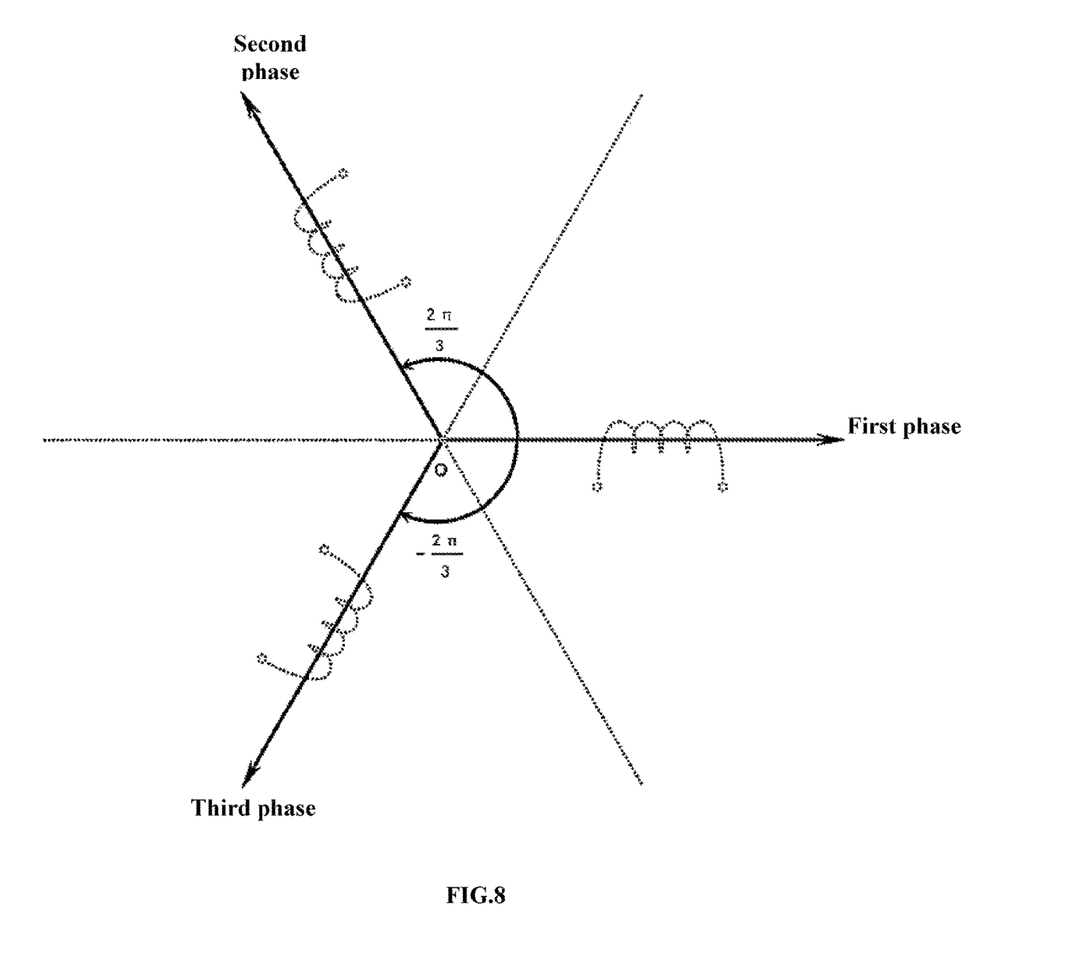
FIG. 8 is a distribution diagram of a winding axis of another deflection scanning device with a multi-phase winding of the present invention.

As shown in FIG. 6 and FIG. 7, embodiment 2 of the present invention provides a deflection scanning device 1 with a 3-phase winding, the deflection scanning device 1 comprising: a ferromagnetic frame 11 and a deflection scanning winding 12, wherein the ferromagnetic frame 11 is made of high-frequency magnetic conductive material and is of an axisymmetric cylindrical structure, the inner side of the ferromagnetic frame 11 is provided with 24 (a=4, w=3) wire slots extending longitudinally and equally distributed along the circumference, and an effective acting space of the magnetic induction intensity of the deflection scanning device 1 composed of a cavity enclosed by the inner wall of the ferromagnetic frame 11, the space being used as a flight channel for the charged particle beam to pass through the deflection scanning device 1;

the deflection scanning winding 12 is formed by coiling a varnished wire, the deflection scanning winding 12 is composed of an electrically and mutually insulated 3-phase winding, the axis of the 3-phase winding is symmetrically distributed on the cross section of the deflection scanning device 1, that is, there is a radian angle of $$\Delta\theta = \frac{2\pi}{3}$$

between axes of every two phase windings, as shown in FIG. 8, each phase winding 12i occupies 24 wire slots, and the computational formula for distributed number of turns of any phase winding 12i in any wire slot is:

$$\lambda_{i,n} = \int_{(i-1)\Delta\theta + \frac{(n-1)\pi}{12}}^{(i-1)\Delta\theta + \frac{n\pi}{12}} \sin\alpha \, d\alpha = \cos\left((i-1)\Delta\theta + \frac{(n-1)\pi}{12}\right) - \cos\left((i-1)\Delta\theta + \frac{n\pi}{12}\right);$$

$$z = \frac{Z_{min}}{\lambda_{min}};$$

$$Z_{i,n} = \lambda_{i,n}z;$$

where if $\lambda_{i,n}$ represents a coefficient of the number of turns of the $i^{th}$ (i=1, 2, 3) phase winding in the $n^{th}$ (n=1, 2, ..., 24) slot, and if $\lambda_{i,n}$ is negative, $Z_{i,n}$ is also negative, indicating that the coiling directions of the windings are opposite, $\lambda_{min}$ represents a coefficient of the minimum positive number of turns in the 24 slots, $\lambda_{min}$=0.034074173711, $Z_{min}$ represents a selected minimum positive integer number of turns corresponding to $\lambda_{min}$, the selected $Z_{min}$=2, z represents a reference value of the number of turns of each phase winding, z=2÷0.034074173711≈58.7, $Z_{i,n}$ represents the number of turns of the $i^{th}$ phase winding in the $n^{th}$ slot, and the absolute value of $Z_{i,n}$ is rounded according to the absolute value of the computed value thereof.

Each phase winding 12i is connected with one phase drive circuit 2i in the drive power supply unit 2 correspondingly, after energization, the 3-phase winding produces resultant magnetomotive force perpendicular to the flight direction of the charged particle beam on the cross section of the deflection scanning device 1, the resultant magnetomotive force produces directly proportional resultant magnetic induction intensity, and the resultant magnetic induction intensity drives the charged particle beam to move on a plane perpendicular to the flight direction of the charged particle beam. That is, after the charged particle beam passes through the deflection scanning device 1 in the axial direction, the axis of the charged particle beam is offset to the vertical direction of the resultant magnetic induction intensity on the cross section of deflection scanning device 1, and the offset taper angle is directly proportional to the amplitude of the resultant magnetic induction intensity on the cross section of deflection scanning device 1. In the case where other parameters are identical, the offset position coordinates of the charged particle beam are in one-to-one correspondence with the resultant magnetomotive force.

Embodiment 2 of the present invention also relates to a deflection scanning system with a 3-phase winding 12i, as shown in FIG. 4, comprising a deflection scanning device 1, a central control unit 3 and a drive power supply unit 2, wherein each phase winding 12i in the deflection scanning device 1 is connected with one phase drive circuit 2i in the drive power supply unit 2 correspondingly; and each phase drive circuit 2i is connected with the central control unit 3;

the deflection scanning device 1 is of a non-salient-pole structure and comprises a 3-phase winding, wherein the $i^{th}$ phase winding is connected with the corresponding $i^{th}$ phase drive circuit in the drive power supply unit 2; the deflection scanning device 1 is mounted at the charged particle beam outlet end of a charged particle beam generator, and the charged particle beam is deflected and emitted after passing through the deflection scanning device 1 and is emitted on the surface of a workpiece finally;

the drive power supply unit 2 is composed of 3-phase drive circuits, wherein, the structures and performance of all phase drive circuits 2i are identical, each phase drive circuit 2i is used to convert one phase voltage instruction signal $U_i^*(t)$ into a phase current instruction signal $I_i^*(t)$ and then linearly amplify same, and supply an amplified current $I_i(t)$ to the corresponding phase winding 12i in the deflection scanning device 1 as a drive current;

the central control unit 3 is used to sequentially divide predetermined charged particle beam deflection scanning tracks into a limited number of deflection scanning spots, sequentially compute the component magnetomotive force values of each phase winding of the 3-phase winding respectively corresponding to each deflection scanning spot, and sequentially send corresponding 3-phase voltage instruction signals $U_1^*(t)$, $U_2^*(t)$, $U_2^*(t)$ to corresponding 3-phase drive circuits 2i according to the component magnetomotive force values of all the deflection scanning spots.

The drive power supply unit 2 includes a pair of positive and negative power supplies $E_1$ and $E_2$ and 3-phase drive circuits, wherein the pair of DC power supplies $E_1$ and $E_2$ are used to output positive and negative symmetrical voltage values, and supply power to the 3-phase drive circuits 2i, that is, the positive pole of the positive power supply $E_1$ is connected to the positive input ends of the 3-phase drive circuits 2i simultaneously, the negative pole of the negative power supply $E_2$ is connected to the negative input ends of the 3-phase drive circuits 2i simultaneously, and the common end of the pair of DC power supplies $E_1$ and $E_2$ is, connected to the grounded ends of the 3-phase drive circuits 2i simultaneously.

The structures and performance of the 3-phase drive circuits are identical, and are completely identical to those of the circuits of the phase drive circuits 2i in embodiment 1, as shown in FIG. 5.

In this description, exemplary statements for the above terms shall not be interpreted to aim at the same embodiment or example. Moreover, the described specific features, structures, materials or characteristics can be combined appropriately in any one or more embodiments or examples. In addition, those skilled in the art can combine and integrate different embodiments or examples and features of different embodiments or examples illustrated in this description without conflict.

The above is just preferred embodiments of the present invention and is not intended to limit the present, invention. Any modification, equivalent replacement, improvement, etc. made within the spirit and the principle of the present invention shall be contained within the protection scope of the present invention.

The invention claimed is:

1. A deflection scanning device with a multi-phase winding, wherein, the deflection scanning device (1) is of an axisymmetric trumpet or cylindrical structure, and the deflection scanning device (1) comprises: a ferromagnetic frame (11) and a deflection scanning winding (12), wherein the inner side of the ferromagnetic frame (11) is provided with 2aw wire slots extending longitudinally and equally distributed along the circumference, and a charged particle beam channel of the deflection scanning device composed of a cavity enclosed by the inner wall of the ferromagnetic frame (11), where a and w are integers and a≥1, w≥3; and the deflection scanning winding (12) comprises a w-phase winding (12i), wherein the axis of the w-phase winding (12i) is symmetrically distributed on the cross section of the deflection scanning device (1);

each phase winding (12i) is connected with one phase drive circuit (2i) correspondingly, after energization, the w-phase winding (12i) produces resultant magnetomotive force perpendicular to the flight direction of the charged particle beam on the cross section of the deflection scanning device (1), the resultant magnetomotive force produces directly proportional resultant magnetic induction intensity, and the resultant magnetic induction intensity drives the charged particle beam to move on a plane perpendicular to the flight direction of the charged particle beam.

2. The deflection scanning device according to claim 1, wherein, the ferromagnetic frame (11) is made of high-frequency magnetic conductive material.

3. The deflection scanning device (1) according to claim 1, wherein, the included angle between axes of adjacent two phase windings is a radian angle of $$\Delta\theta = \frac{\pi}{w}$$

if w is even, the included angle between axes of adjacent two phase windings is a radian angle of $$\Delta\theta = \frac{2\pi}{w}$$

if w is odd, and the computational formula for distributed number of turns of any phase winding (12i) in any wire slot is:

$$\lambda_{i,n} = \int_{(i-1)\Delta\theta+\frac{(n-1)\pi}{aw}}^{(i-1)\Delta\theta+\frac{n\pi}{aw}} \sin\alpha \, d\alpha =$$

$$\cos\left((i-1)\Delta\theta + \frac{(n-1)\pi}{aw}\right) - \cos\left((i-1)\Delta\theta + \frac{n\pi}{aw}\right);$$

$$z = \frac{Z_{min}}{\lambda_{min}};$$

$$Z_{i,n} = \lambda_{i,n} z;$$

where if $\lambda_{i,n}$ represents a coefficient of the number of turns of the $i^{th}$ (i=1, 2, ..., w) phase winding in the $n^{th}$ (n=1, 2, ..., 2aw) slot, and if $\lambda_{i,n}$ is negative, $Z_{i,n}$ is also negative, indicating that the coiling directions of the windings are opposite, $\lambda_{min}$ represents a coefficient of the minimum positive number of turns in the 2aw slots, $Z_{min}$ represents a selected minimum positive integer number of turns corresponding to $\lambda_{min}$, z represents a reference value of the number of turns of each phase winding, $Z_{i,n}$ represents the number of turns of the $i^{th}$ phase winding in the $n^{th}$ slot, and the absolute value of $Z_{i,n}$ is rounded according to the absolute value of the computed value thereof.

4. A deflection scanning system with a multi-phase winding, comprising the deflection scanning device (1) of claim 1 claims 1-3, a central control unit (3) and a drive power supply unit (2), wherein each phase winding (12i) in the deflection scanning device (1) is connected with one phase drive circuit (2i) in the drive power supply unit (2) correspondingly; and each phase drive circuit (2i) is connected with the central control unit (3);

the central control unit (3) is used to sequentially divide predetermined charged particle beam deflection scanning tracks into a limited number of deflection scanning spots, sequentially compute the component magnetomotive force values of each phase winding (12i) of the w-phase winding (12i) respectively corresponding to each deflection scanning spot, and sequentially send corresponding w-phase voltage instruction signals to corresponding w-phase drive circuits (2i) according to the component magnetomotive force values of all the deflection scanning spots; and the drive power supply unit (2) comprises w-phase drive circuits (2i), wherein each phase drive circuit (2i) is used to convert one phase voltage instruction signal corresponding thereto into one phase current instruction signal including voltage instruction amplitude and differential value information thereof, and linearly amplify the phase current instruction signal; and supply a phase drive current amplified according to the phase current instruction signal to one phase winding (12i) correspondingly connected therewith in the deflection scanning device (1).

5. The deflection scanning system according to claim 4, wherein, the drive power supply unit (2) further comprises a pair of DC power supplies $E_1$ and $E_2$, wherein the pair of DC power supplies $E_1$ and $E_2$ are connected in series, are used to output positive and negative symmetrical voltage values to the w-phase drive circuits (2i), and the common end of the pair of DC power supplies $E_1$ and $E_2$ is grounded.

6. The deflection scanning system according to claim 5, wherein each of the phase drive circuits (2*i*) comprises: an instruction input circuit (2*i*1), a push-pull amplifier circuit (2*i*2), a damping feedback circuit (2*i*3) and an operation amplifier $A_i$, wherein one end of the instruction input circuit (2*i*1) is connected with the central control unit (3), and the other end thereof is connected with the negative input end of the operation amplifier $A_i$;

the control end of the push-pull amplifier circuit (2*i*2) is connected with one end of a control resistor $R_{6i}$, the positive and negative input ends of the push-pull amplifier circuit (2*i*2) are connected with the positive and negative poles of the pair of DC power supplies $E_1$ and $E_2$ respectively, and the output end of the push-pull amplifier circuit (2*i*2) is connected with one end of the damping feedback circuit (2*i*3) and one end of a corresponding phase winding (12*i*) in the deflection scanning device (1) respectively;

the other end of the damping feedback circuit (2*i*3) is connected with the negative input end of the operation amplifier $A_i$; and the output end of the operation amplifier $A_i$ is connected with the other end of the control resistor $R_{6i}$;

the other end of the corresponding phase winding (12*i*) in the deflection scanning device (1) is connected with the non-grounded end of a sampling resistor $R_{8i}$, and the other end of the sampling, resistor $R_{8i}$ is grounded;

the non-grounded end of the sampling resistor $R_{8i}$ is also connected with one end of a feedback resistor $R_{7i}$, the other end of the feedback resistor is connected to the negative input end of the operation amplifier $A_i$, the positive input end of the operation amplifier $A_i$ is connected with one end of a balancing resistor $R_{3i}$, the other end of the balancing resistor $R_{3i}$ is grounded, and the positive and negative power supply input ends of the operation amplifier $A_i$ are connected with the positive and negative poles of the pair of DC power supplies $E_1$ and $E_2$ respectively.

\* \* \* \* \*